US007764502B2

(12) United States Patent
Erb et al.

(10) Patent No.: US 7,764,502 B2
(45) Date of Patent: Jul. 27, 2010

(54) CONTROL DEVICE, IN PARTICULAR IN THE FORM OF AN ELECTRIC SWITCH FOR ELECTRIC HANDTOOLS

(75) Inventors: Tino Erb, Gailingen (DE); Dirk Pfeiffer, Gottmadingen (DE); Klaus Fiederer, Dübheim (DE)

(73) Assignee: Marquardt GmbH, Rietheim-Weilheim (DE)

( * ) Notice: Subject to any disclaimer, the term of this patent is extended or adjusted under 35 U.S.C. 154(b) by 0 days.

(21) Appl. No.: 12/365,945

(22) Filed: Feb. 5, 2009

(65) Prior Publication Data

US 2009/0213545 A1 Aug. 27, 2009

Related U.S. Application Data

(63) Continuation of application No. PCT/DE2007/001408, filed on Aug. 9, 2007.

(30) Foreign Application Priority Data

Aug. 10, 2006 (DE) ....................... 10 2006 037 446

(51) Int. Cl.
*H05K 7/20* (2006.01)

(52) U.S. Cl. ....................... 361/700; 361/699; 361/704; 174/15.2; 165/80.4; 165/104.26

(58) Field of Classification Search ....................... None
See application file for complete search history.

(56) References Cited

U.S. PATENT DOCUMENTS

| | | | | |
|---|---|---|---|---|
| 5,798,584 | A | 8/1998 | Schaeffeler et al. | |
| 6,043,980 | A * | 3/2000 | Katsui | 361/695 |
| 6,049,460 | A | 4/2000 | Lin | |
| 6,237,698 | B1 * | 5/2001 | Carrier et al. | 173/2 |
| 6,692,864 | B1 * | 2/2004 | Dansui et al. | 429/120 |
| 6,822,866 | B2 * | 11/2004 | Fearing et al. | 361/701 |
| 7,157,882 | B2 * | 1/2007 | Johnson et al. | 320/134 |
| 7,292,438 | B2 * | 11/2007 | Chen et al. | 361/699 |
| 7,424,907 | B2 * | 9/2008 | Chou et al. | 165/80.4 |
| 2006/0091858 | A1 | 5/2006 | Johnson et al. | |
| 2009/0145621 | A1 * | 6/2009 | Lau et al. | 173/217 |

FOREIGN PATENT DOCUMENTS

| | | | |
|---|---|---|---|
| DE | 30 45 610 | A1 | 8/1982 |
| DE | 195 08 925 | A1 | 9/1996 |
| WO | 2005/045863 | A1 | 5/2005 |

* cited by examiner

*Primary Examiner*—Boris L Chervinsky
(74) *Attorney, Agent, or Firm*—Burr & Brown

(57) ABSTRACT

A control device, in particular an electrical switch for use for an electrical tool such as a rechargeable-battery and/or plug-powered electrical tool having an electric motor. The switch has a housing for holding at least one heat-generating component such as a power transistor, a MOSFET, a triac or the like, which is arranged in particular in an electrical circuit arrangement which, for example, is used for open-loop and/or closed-loop control of the electric motor by appropriate open-loop and/or closed-loop control of the electrical load current flowing through the component to the electric motor. A means for thermal conduction is connected on the one hand to the housing of the electrical switch, and/or to the heat-generating component, in particular to the power semiconductor which is located in the housing, and on the other hand to a cooled area which is associated with the switch.

14 Claims, 1 Drawing Sheet

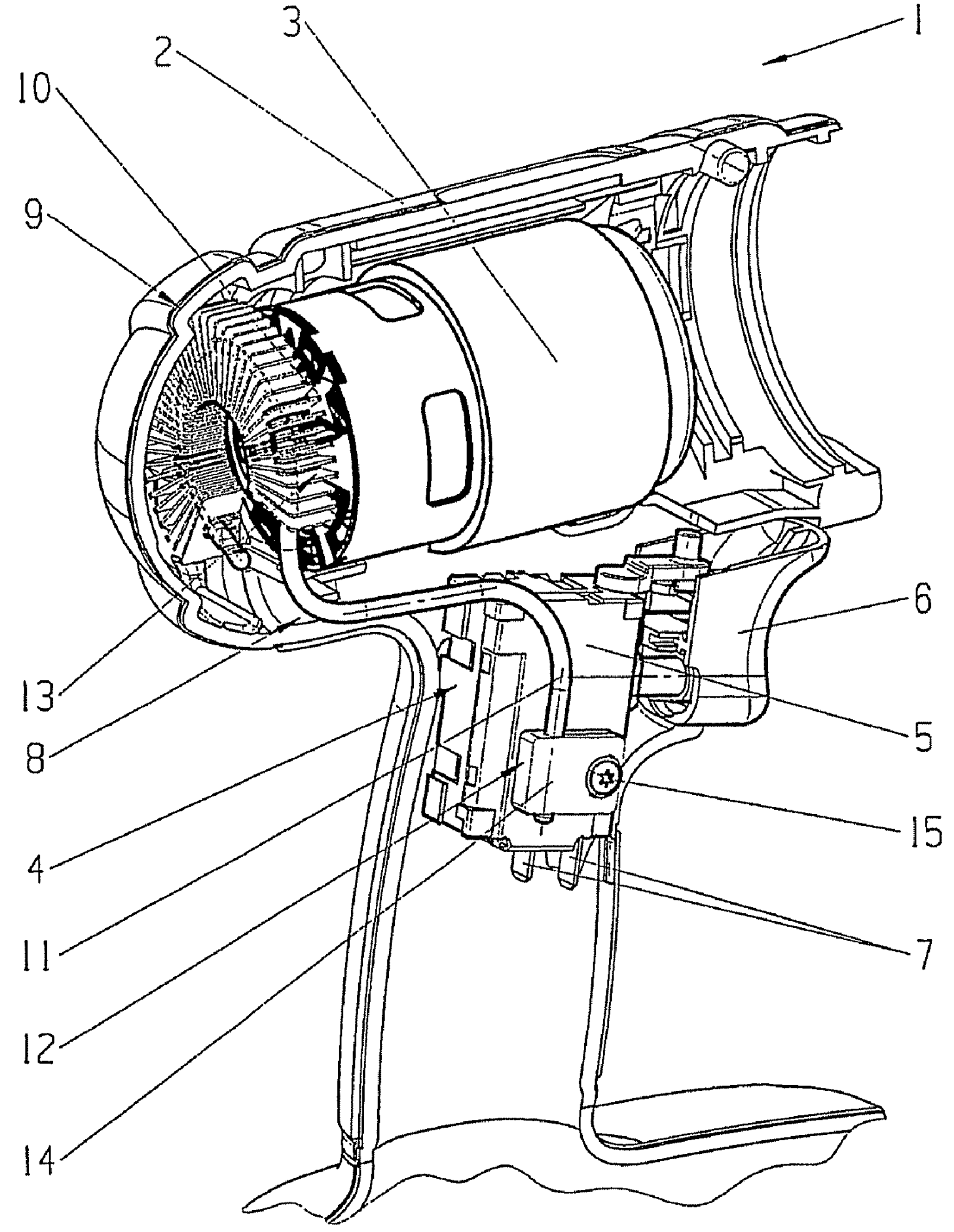
1
2
3
10
9
6
13
5
8
15
4
11
7
12
14

CONTROL DEVICE, IN PARTICULAR IN THE FORM OF AN ELECTRIC SWITCH FOR ELECTRIC HANDTOOLS

CROSS REFERENCE TO RELATED APPLICATIONS

This application is a continuation of International Application No. PCT/DE2007/001408, filed Aug. 9, 2007, which designated the United States, and claims the benefit under 35 USC §119(a)-(d) of German Application No. 10 2006 037 446.0 filed Aug. 10, 2006, the entireties of which are incorporated herein by reference.

FIELD OF THE INVENTION

The invention relates to a control device, particularly a control device used as an electrical switch for an electrical tool.

BACKGROUND OF THE INVENTION

Control devices such as these are used in particular as electrical switches for an electrical handtool having an electric motor, such as a rechargeable-battery and/or plug-powered electrical tool. These electrical tools may be drilling machines, grinders, saws, planes, angle grinders or the like.

SUMMARY OF THE INVENTION

DE 195 08 925 Al discloses an electrical switch for an electrical tool, which has a housing for holding an electrical circuit arrangement for open-loop and/or closed-loop control of the electric motor. A circuit arrangement such as this may be an electronics module for open-loop and/or closed-loop control of the rotation speed of the electric motor, for example by pulse-width modulation. The circuit arrangement, which is located in the housing, now in turn contains at least one component, such as a power semiconductor, a power transistor, a MOSFET, a triac or the like, which is used for appropriate open-loop and/or closed-loop control of the electrical load current flowing through the component to the electric motor.

By virtue of its function as a power component, the component generates a power loss in the form of heat, which must be dissipated from the housing. Other parts of the circuit arrangement can likewise generate heat losses. A heat sink, which is located on the outside of the housing, is used to dissipate this heat. It has now been found that, in some cases, the heat dissipation which can be achieved in this way is not sufficient. This may be the case in particular with a high-power switch for direct-current motors in electrical tools, to be precise for example in the case of electrical tools which operate using lithium-ion rechargeable batteries. It is obvious that, in situations such as this, the operational reliability of the switch and therefore of the electrical tool as well suffers.

The invention is based on the object of improving the heat dissipation from the housing. One particular aim in this context is to provide a solution as to how the heat which is produced in the power semiconductor of the switch can be dissipated efficiently and quickly and can be transported to an area of the electrical tool where the heat is then dissipated by the motor cooling air flow there.

In the control device according to the invention, a means for thermal conduction is connected on the one hand to the housing and/or to the heat-generating component, in particular to the power semiconductor which is located in the housing, and on the other hand to a cooled area. The cooled area is located outside and/or separately from the housing and, in particular, is associated with the control device. If the control device is an electrical switch, then the means for thermal conduction is connected to the housing of the electrical switch. The invention advantageously helps to improve the operational reliability of the control device and/or of the switch, and therefore also the operational reliability of the electrical tool.

Further purposes for a circuit arrangement, in particular in the form of an electrics module, such as this in the electrical tool can be for open-loop and/or closed-loop control of free-running, for example by means of diodes, the torque, for example by closed-loop current control for the electric motor, or other characteristic variables, such as automatic switch-off, automatic closed-loop control, electronic braking, electronic soft starting of the electric motor, or the like. An increase in the reliability against failure is also achieved in situations such as this with the aid of the heat dissipation according to the invention from the circuit arrangement.

The heat can be dissipated particularly efficiently if the means for thermal conduction comprises a heat pipe. The heat pipe has a vaporization region at one end and a condensation region at the other end. The heat pipe is expediently for this purpose closed at one end by a vaporizer plate and at the other end by a condensation plate. The heat pipe also contains a fluid, such that the fluid transports heat, with a phase change, to be precise vaporization and condensation, between the vaporization region and the condensation region.

The heat pipe may be mechanically and/or thermally linked to the power semiconductor. In one embodiment, the one end of the heat pipe is attached in the form of a housing attachment to the housing in the area of the power semiconductor, for example by means of a screw, for simple assembly. In order to achieve a compact arrangement, the housing attachment surrounds the vaporizer plate, which makes thermal contact with the power semiconductor.

The heat pipe may be in the form of a flexible and/or preformed hose. Its profile can then be appropriately matched to the physical space between the housing and the cooled area, corresponding to the housing guide in the electrical tool, that is to say corresponding to the characteristics of the electrical tool housing. In consequence, the heat pipe does not require any additional space in the electrical tool.

The cooled area can be arranged at an expedient point inside and/or on the electrical tool. It is particularly advantageous for this cooled area to be located in the area of the motor cooling air flow. In order to achieve a compact design, it is possible for the condensation plate to be arranged in the cooled area, with the motor cooling air flow then flowing around the condensation plate.

In summary, for a particularly preferred refinement, it can be stated that the heat pipe is mechanically and/or thermally linked to the power semiconductor such that the heat pipe transports the heat into the area of the motor cooling air flow. Heat can be transported efficiently and quickly with the aid of heat pipes from a hot point to another cooler point, for which reason these heat pipes are sometimes also referred to as thermal superconductors. The heat transport, in terms of the amount of heat and the speed, may correspond to approximately 100 to 10,000 times that of a geometrically identical component composed of solid copper as a heat sink.

The advantages achieved by the invention are, in particular, that the improved heat dissipation allows for the use of new, higher power ranges. Furthermore, this is a passive cooling system so that no energy is required for operation of the means for cooling, and this is particularly advantageous for use in rechargeable-battery-powered tools. Finally, it is also possible to use physically smaller electronic components and power semiconductors with lower specifications, and this leads to cost savings. Furthermore, it is possible to dispense with the expensive heat sinks which are required for present-day switches. The invention advantageously provides a direct-current (DC) high-power switch for use in handheld electrical tools in the upper power range, which is particularly suitable for electrical tools which operate using lithium-ion rechargeable batteries.

BRIEF DESCRIPTION OF THE DRAWING

One exemplary embodiment of the invention together with various developments and refinements will be described in more detail in the following text and is illustrated in the drawing.

The FIGURE shows a housing, illustrated in an open state, for an electrical tool.

DETAILED DESCRIPTION OF THE INVENTION

The FIGURE shows a housing half-shell 2 for an electrical tool 1 in a manner in which the electric motor 3, which is located in the electrical tool housing of the electrical tool 1, can be seen together with the fan impeller 10, which generates the cooling air flow for the electric motor 3, and the electrical switch 4. The electrical tool 1 may be a rechargeable-battery and/or plug-powered electrical tool, for example a drilling machine, a grinder, a saw, a plane, an angle grinder or the like.

The switch 4 has a housing 5 which is used to hold a contact system, which comprises a known moving switching contact as well as a known stationary contact, both of which are not shown in the FIGURE. The housing 4 is held in the housing half-shell 2 such that an operating member 6, which is arranged on the housing 5 and can be moved manually by the user, projects out of the handle on the housing half shell 2. The operating member 6 acts on the switching contact to switch the contact system, such that the electrical tool 1 can be switched on and/or off by means of the operating member 6. Electrical connections 7 are also located on the housing 5 for connection of the switch 4 to a power source, for example to a rechargeable battery. Additional electrical connections (not shown) are provided to allow connection of the switch 4 to the electric motor 3.

Finally, an electrical circuit arrangement for open-loop and/or closed-loop control of the electric motor 3 is located in the housing 5 of the switch 4. The circuit arrangement is used as control electronics in order to vary the rotation speed of the electric motor 3. For this purpose, the circuit arrangement has at least one associated, heat-generating power component, such as a power semiconductor, a power transistor, a MOS-FET, a triac or the like, thus resulting in appropriate open-loop and/or closed-loop control of the electrical load current flowing through the power component to the electric motor 3.

In order to dissipate the heat losses, which are generated for example by the power component and/or the circuit arrangement, from the housing 5 of the switch 4, a means 8 for thermal conduction is connected on the one hand to the housing 5 of the electrical switch 4 and on the other hand to a cooled area 9 within the housing half-shell 2. The cooled area 9 can be arranged at a suitable point inside and/or on the electrical tool 1. It is particularly efficient for the cooled area 9 to be located in the motor cooling air flow for the electric motor 3 of the electrical tool 1, with that end of the means 8 for thermal conduction which is averted from the switch 4 ending on the electric motor 3 in the vicinity of the fan impeller 10, which is only indicated schematically. Of course, that end of the means 8 for thermal conduction which faces the switch 4 may also be directly connected to the heat-generating component, in particular to the power semiconductor which is located in the housing 5.

As can also be seen from the FIGURE, the means 8 for thermal conduction comprises a heat pipe 11. At one end, the heat pipe 11 has a vaporization region 12, which may comprise a vaporizer plate which closes the heat pipe 11, and at the other end it has a condensation region 13, which may comprise a condensation plate which closes the heat pipe 11 and is in the form of a fan. The heat pipe 11 contains a fluid such that the fluid transports heat between the vaporization plate 12 and the condensation plate 13, operating in a known manner with a phase change, that is to say by vaporization on the vaporizer plate 12 and by condensation on the condensation plate 13.

The heat pipe 11 is mechanically and/or thermally linked to the power semiconductor which is located in the housing 5. For this purpose, the one end of the heat pipe 11 is attached in the form of a housing attachment 14 to the housing 5 in the area of the power semiconductor. A screw 15 can be used for attachment. The housing attachment 14 surrounds the vaporizer plate 12, which makes thermal contact with the power semiconductor.

The heat pipe 11 is in the form of a flexible and/or preformed hose. The profile of the heat pipe 11 can thus be appropriately matched to the available physical space between the housing 5 and the cooled area 9, that is to say corresponding to the housing guide in the housing half-shell 2 of the electrical tool 1. In the present case, as can be seen from the FIGURE, the heat pipe 11 is approximately S-shaped, with the condensation region curling around the axis of the fan impeller 10 of the electric motor 3.

The invention is not restricted to the described and illustrated exemplary embodiment. In fact, it also covers all specialist developments within the scope of the invention as defined by the patent claims. The invention can therefore be used not only for electrical tool switches as high-power switches in AC and/or DC electrical tools, but can also be used for other switches, for example those for domestic electrical appliances, electrical garden appliances, machine tools or the like. In the same way, the invention can also be used for control devices with or without a housing, for example for the power electronics of the electrical tool, for motor vehicles or the like.

LIST OF REFERENCE SYMBOLS

1: Electrical tool
2: Housing half-shell
3: Electric motor
4: (Electrical) switch
5: Housing (of switch)
6: Operating member
7: (Electrical) connection (of the switch)
8: Means for thermal conduction
9: Cooled area
10: Fan impeller (on the electric motor)
11: Heat pipe
12: Vaporization region/vaporizer plate
13: Condensation region/condensation plate
14: Housing attachment
15: Screw

What is claimed:

1. A control device for an electric motor comprising a housing for holding at least one heat-generating component that is arranged in an electrical circuit arrangement that is used for control of the electric motor by controlling an electrical load current flowing through said heat-generating component to the electric motor, and means for thermal conduction connected on one end thereof to the housing and on another end thereof to a cooled area associated with said control device, wherein said means for thermal conduction comprises a heat pipe having a vaporization region at said one end thereof and a condensation region at said another end thereof, said heat pipe containing a fluid that transports heat, with a phase change, between said vaporization region and said condensation region, wherein said one end of said heat pipe is thermally linked to said heat-generating component by a housing attachment connected to said housing in an area of said heat-generating component, and wherein said housing attachment surrounds said vaporization region, and said vaporization region is in thermal contact with said heat-generating component.

2. The control device of claim 1, wherein said one end of said heat pipe is closed by a vaporizer plate and said another end thereof is closed by a condenser plate.

3. The control device of claim 1, wherein said one end of said heat pipe is mechanically linked to said heat-generating component.

4. The control device of claim 1, wherein said housing attachment is connected to said housing by a screw.

5. The control device of claim 1, wherein said heat pipe is a flexible hose having a profile matched to a physical space between said housing and said cooled area.

6. The control device of claim 5, wherein said heat pipe is a preformed hose.

7. An electrical switch for an electrical tool having an electric motor, comprising a housing for holding at least one heat-generating component arranged in an electrical circuit arrangement that is used for control of the electric motor by controlling an electrical load current flowing through said heat-generating component to the electric motor, and means for thermal conduction connected on one end thereof to the housing and on another end thereof to a cooled area associated with said electrical switch, wherein said means for thermal conduction comprises a heat pipe having a vaporization region at said one end thereof and a condensation region at said another end thereof, said heat pipe containing a fluid that transports heat, with a phase change, between said vaporization region and said condensation region, wherein said one end of said heat pipe is thermally linked to said heat-generating component by a housing attachment connected to said housing in an area of said heat-generating component, and wherein said housing attachment surrounds said vaporization region and said vaporization region is in thermal contact with said heat-generating component.

8. The electrical switch of claim 7, wherein said one end of said heat pipe is closed by a vaporizer plate and said another end thereof is closed by a condenser plate.

9. The electrical switch of claim 7, wherein said one end of said heat pipe is mechanically linked to said heat-generating component.

10. The electrical switch of claim 7, wherein said housing attachment is connected to said housing by a screw.

11. The electrical switch of claim 7, wherein said heat pipe is a flexible, preformed hose having a profile matched to a physical space between said housing and said cooled area.

12. The electrical switch of claim 7, wherein said power-generating component is one selected from the group consisting of a power transistor, a MOSFET, and a triac.

13. The electrical switch of claim 7, wherein the electrical circuit arrangement performs at least one of open-loop and closed-loop control of the electric motor.

14. An electrical tool, comprising an outer shell, an electric motor, a fan impeller for providing cooling air for the electric motor and an electrical switch for controlling said electric motor, said electrical switch comprising (i) a housing for holding at least one heat-generating component arranged in an electrical circuit arrangement that is used for control of the electric motor by controlling an electrical load current flowing through said heat-generating component to the electric motor, and (ii) means for thermal conduction connected on one end thereof to the housing and on another end thereof to a cooled area within said outer shell proximate said fan impeller, wherein said means for thermal conduction comprises a heat pipe having a vaporization region at said one end thereof and a condensation region at said another end thereof, said heat pipe containing a fluid that transports heat, with a phase change, between said vaporization region and said condensation region, wherein said one end of said heat pipe is thermally linked to said heat-generating component by a housing attachment connected to said housing in an area of said heat-generating component, and wherein said housing attachment surrounds said vaporization region, and said vaporization region is in thermal contact with said heat-generating component.

* * * * *